US012666701B2

(12) United States Patent
Li et al.

(10) Patent No.: US 12,666,701 B2
(45) Date of Patent: Jun. 23, 2026

(54) LOGIC GATES

(71) Applicant: Micron Technology, Inc., Boise, ID (US)

(72) Inventors: Wenjun Li, Meridian, ID (US);
Seong-Dong Kim, Boise, ID (US);
Anda Mocuta, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 799 days.

(21) Appl. No.: 17/868,737

(22) Filed: Jul. 19, 2022

(65) Prior Publication Data

US 2024/0030219 A1 Jan. 25, 2024

(51) Int. Cl.
*H10D 84/83* (2025.01)
*H03K 19/20* (2006.01)

(52) U.S. Cl.
CPC ............. *H10D 84/83* (2025.01); *H03K 19/20* (2013.01)

(58) Field of Classification Search
CPC ............. H10D 30/603; H10D 30/0221; H10D 84/83–85; H03K 19/20
See application file for complete search history.

(56) References Cited

U.S. PATENT DOCUMENTS

| | | | |
|---|---|---|---|
| 9,536,877 B2 | 1/2017 | Cai et al. | |
| 10,607,995 B2 | 3/2020 | Roberts et al. | |
| 2004/0000676 A1* | 1/2004 | Fujioka | H10W 44/20 |
| | | | 257/E21.627 |
| 2007/0114617 A1* | 5/2007 | Komori | H10D 84/0133 |
| | | | 257/408 |
| 2018/0190785 A1* | 7/2018 | Hung | H10D 84/0158 |
| 2018/0323200 A1 | 11/2018 | Tang et al. | |
| 2019/0103406 A1 | 4/2019 | Tang et al. | |
| 2019/0164985 A1 | 5/2019 | Tang et al. | |
| 2021/0013226 A1 | 1/2021 | Tang et al. | |
| 2022/0399453 A1* | 12/2022 | Lai | H03K 19/20 |
| 2023/0063607 A1* | 3/2023 | Bae | H10D 64/251 |

OTHER PUBLICATIONS

Alli, The Design of High Performance Three Input XOR Gate Based on Compound Gate Methodology, 2021 (Year: 2021).*

* cited by examiner

*Primary Examiner* — Britt Hanley
*Assistant Examiner* — Casey Paul Boatman
(74) *Attorney, Agent, or Firm* — Brooks, Cameron & Huebsch, PLLC

(57) ABSTRACT

Embodiment herein relate to logic gates. An example of a logic gate includes a semiconductor material, source regions having a first width, drain regions having a second width that is different than the first width, transistor gates, and electrical contacts coupled to the source regions and the drain regions.

14 Claims, 3 Drawing Sheets

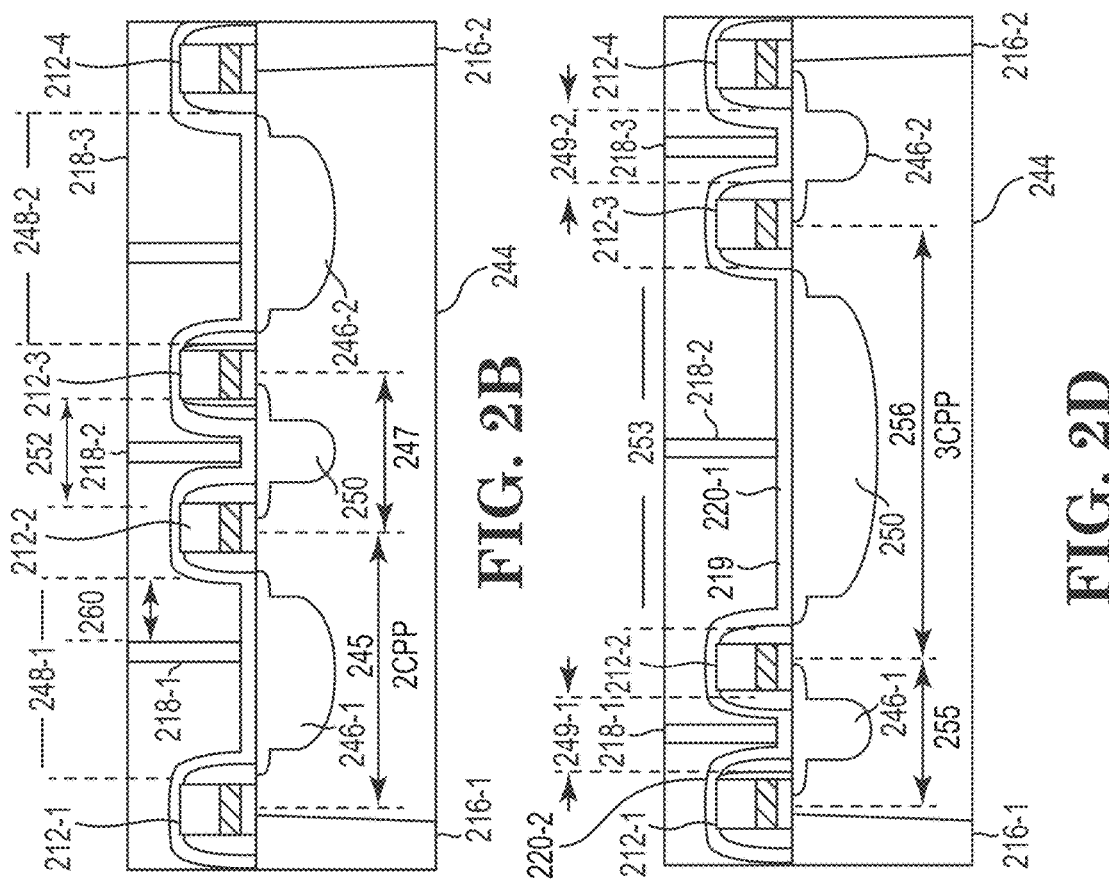
FIG. 2B
FIG. 2D
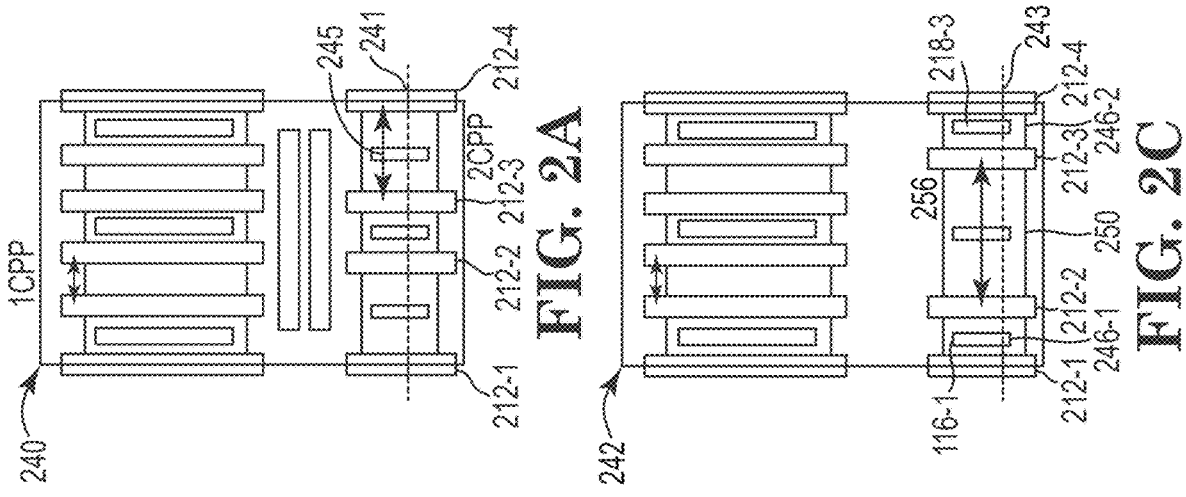
FIG. 2A
FIG. 2C

LOGIC GATES

TECHNICAL FIELD

The present disclosure relates generally to logic gates, and more particularly, to logic gates with enhanced channel stress.

BACKGROUND

Memory is one type of integrated circuitry and can be used in computer systems for storing data. Memory may be fabricated in one or more arrays of individual memory cells. Memory cells may be written to, or read from, using digit lines (which may also be referred to as bit lines, data lines, or sense lines) and access lines (which may also be referred to as word lines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A transistor is one type of electronic component that may be used in a memory cell. These transistors can include a pair of conductive source/drain regions having a semiconductive channel region there-between. A conductive transistor gate can be adjacent the channel region and be separated there-from by a thin gate insulator. Application of a suitable voltage to the transistor gate allows current to flow from one of the source/drain regions to the other through the channel region. When the voltage is removed from the transistor gate, current is largely prevented from flowing through the channel region.

Transistors can be employed to form various memory circuitry. Transistors may be used in control or I/O circuitry on the memory product such as logic gates. For instance, logic gates such as NOR gates and/or NAND gates can include a plurality of transistors and corresponding transistor gates. Logic gates such as NOR and/or NAND gates can be employed in a memory device including memory. For instance, NOR gates and/or NAND gates can be employed in a peripheral area (periphery) of a memory device that is located adjacent to and in communication with an active area of the memory device.

BRIEF DESCRIPTION OF THE DRAWINGS

FIG. 2A is a view of a portion of an example of a NOR gate in accordance with an embodiment of the disclosure.

FIG. 2B is another view of a portion of an example of a NOR gate (N-type transistor) in accordance with an embodiment of the disclosure.

FIG. 2C is a view of a portion of an example of a NOR gate in accordance with an embodiment of the disclosure.

FIG. 2D is another view of a portion of an example of a NOR gate (N-type transistor) in accordance with an embodiment of the disclosure.

DETAILED DESCRIPTION

Figures 1A, 1B, 1C, 1D:
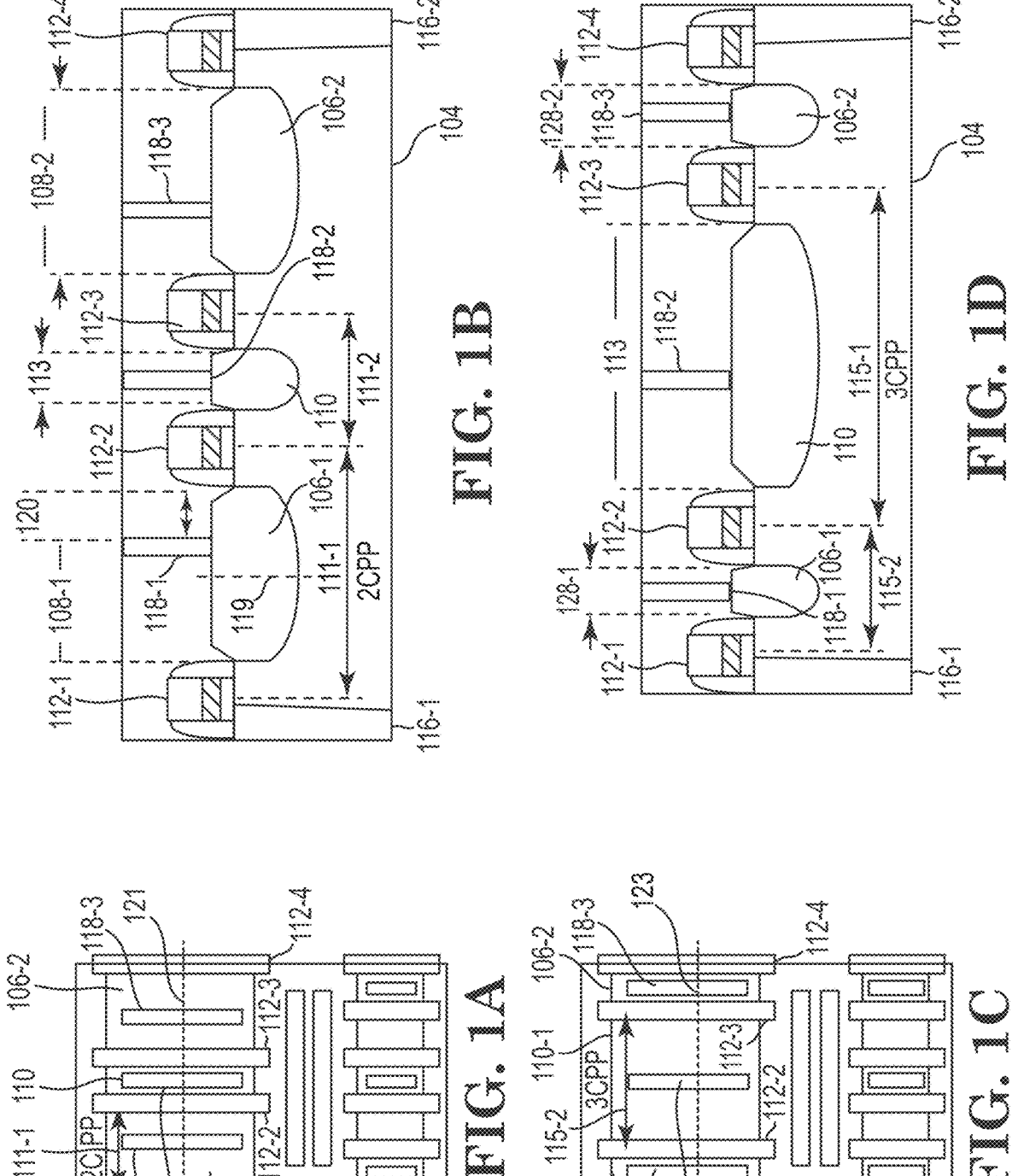
FIG. 1A is a view of a portion of an example of a NAND gate in accordance with an embodiment of the disclosure.
FIG. 1B is another view of a portion of an example of a NAND gate (P-type transistor) in accordance with an embodiment of the disclosure.
FIG. 1C is a view of a portion of an example of a NAND gate in accordance with an embodiment of the disclosure.
FIG. 1D is another view of a portion of an example of a NAND gate (P-type transistor) in accordance with an embodiment of the disclosure.

The present disclosure includes apparatuses, methods, and systems for logic gates. Notably, the logic gates exhibit enhanced (higher) channel stress. The logic gates exhibiting enhanced channel stress can realize improved performance and/or greater efficiency due to the enhanced channel stress and/or an absence of dummy gates and absence of active regions, as detailed herein.

Some previous approaches employ memory devices including "dummy" gates. Dummy gates refer gates which are inactive (e.g., are not used for storing data bits), but are formed from the similar materials and processes as active gates (which are used for storing/altering data bits). For instance, dummy gates can be identical to active gates, but lack the requisite interconnections (e.g., electrical interconnections such as local interface contacts (LICON)) to permit communication with other portions of an electronic memory system or memory device.

Dummy gates can be present at and/or near the ends of active memory cells in an active region. For instance, dummy gates can be present in a periphery of a DRAM memory device adjacent to an active area (including memory cells used for storage of data) of the DRAM memory device. The dummy gates can provide a uniform shape/size of a region (e.g., present in the periphery of DRAM memory devices, which employ a stacked configuration of memory cells) and/or provide given electrical characteristics (e.g., electrical isolation), etc. However, the presence of the dummy gates leads to inefficiencies. For instance, a quantity of active gates over a given amount of area in a memory device is reduced and/or the size of a memory device is increased.

As used herein, channel stress refers to compressive or tensile stress applied to the channel, such as formed by a different source/drain epitaxy material and/or a liner material (e.g., a stress liner such as silicon-nitride material). The compressive stress can enhance p-type transistor performance while the tensile stress can boost n-type transistor. For instance, source/drain epitaxy regions such as SiGe can be grown in p-type transistor and thus a degree of channel compressive stress may be present in a channel between the source/drain regions. For instance, some previous approaches employ source/drain regions may have the uniform (equal) respective widths in an peripheral area of a semiconductor material. Moreover, such previous approaches may employ a uniform gate pitch (e.g., 70 nanometers) between gates associated with the source/drain regions in the peripheral area. Because of the NAND or NOR gate configuration, dummy gates and/or active regions also fill up the empty space to provide uniform environment.

Accordingly, the NAND and NOR gates herein exhibit enhanced (higher) channel stress. That is, compared to other approaches such as those detailed herein, NAND and NOR gates herein have source/drain regions and/or portions of a liner material with larger volumes and thus exhibit enhanced (higher) channel stress. As a result, NAND and NOR gates herein provide higher efficiency in the use of area with the same amount of physical cell area.

For instance, in some embodiments the enhanced channel stress can be in a range from 1 percent to 20 percent greater than an amount of channel stress in other approaches, such as those that dummy gates, active regions having various dimensions, and/or other approaches that employ uniform source/drain widths (e.g., employ only uninform source/drain widths) in a peripheral area, and/or uniform gate pitch (e.g., employ only uniform gate pitch) in a peripheral area. All sub-ranges from about 1 percent to 20 percent are included. For instance, the channel stress can be 1 percent, 3 percent, 5 percent, 10 percent, 15 percent or 20 percent higher than an amount of channel stress in other approaches. For example, channel stress can be about 10 percent higher than an amount of channel stress in other approaches.

The p-type transistors forming NAND gates and n-type transistors forming NOR gates herein exhibit lower electrical resistance. In some embodiments, the resistance can be in a range from about 1 percent to about 15 percent less than an amount of resistance in others approaches described herein. All sub-ranges from about 1 percent to 10 percent are included. For instance, the resistance can be 1 percent, 3 percent, 4 percent, 5 percent, 6 percent, 8 percent, 10 percent, 12 percent, or 15 percent lower than an amount of resistance in other approaches. For example, the resistance can be about 10 percent less than an amount of resistance in other approaches. As used herein, resistance can be determined by standard MOSFET current-voltage measurement in the on-state.

The NAND and NOR gates herein exhibit lower cell capacitance (e.g., effective cell capacitance). In some embodiments, the cell capacitance can be in a range from about 1 percent to about 5 percent less than a cell capacitance in other approaches described herein. All sub-ranges from about 1 percent to 5 percent are included. For instance, the cell capacitance can be 1 percent, 2 percent, 3 percent, 4 percent, or 5 percent lower than cell capacitance in other approaches. For example, cell capacitance can be about 1 percent less than a cell capacitance in other approaches.

The logic gates herein (e.g., NOR gates and NAND gates) exhibit lower gate delay. In some embodiments, the gate delay can be in a range from about 1 percent to about 10 percent less than an amount of gate delay in other approaches described herein. All sub-ranges from about 1 percent to 10 percent are included. For instance, the gate delay can be 1 percent, 3 percent, 4 percent, 5 percent, 6 percent, 8 percent, or 10 percent lower than an amount of gate delay in other approaches. For example, gate delay can be about 6 percent less than an amount of gate delay in other approaches.

The logic gates herein exhibit lower power consumption (under a same workload). In some embodiments, the power consumption under a given workload at the same conditions (e.g., with a 1.1 volt power supply) can be in a range from about 1 percent to about 5 percent less than an amount of power consumption in other approaches described herein. All sub-ranges from about 1 percent to 5 percent are included. For instance, the power consumption can be 1 percent, 2 percent, 3 percent, 4 percent, or 5 percent lower than power consumption in other approaches. For example, power consumption can be about 1 percent less than an amount of power consumption in other approaches.

As used herein the term "about" refers to value(s) that are within 10 percent, within 5 percent or within 1 percent of a given value that the term about modifies. For instance, the term about can refer to a value(s) that are within 10 percent of a given value.

In some embodiments, a first width of a source region (e.g., each source region) can be at least two times greater than a second width of a drain (e.g., each drain region) or the second width of the drain region (e.g., each drain region) can be at least three times greater than the first width of a source region (e.g., each source region). For example, a first width of a source region can be two times greater than a second width of a drain region or a second width of a drain region can be three times greater than a first width of a source region, as detailed herein.

Embodiments herein provide for a non-uniform gate pitch, such as a non-uniform gate pitch (non-uniform transistor gate pitch) in an peripheral area. For instance, a critical polysilicon pitch (cPP) of a first subset of transistor gates in an peripheral area can be at least two times or at least three times greater than a cPP of a second subset of the transistor gates in the peripheral area, as detailed herein. As used herein, cPP refers to a distance from a centerline (e.g., midpoint) of a transistor gate (e.g., a first gate) to a centerline of an adjacent transistor gate (e.g., a second transistor gate that is most proximate to the first transistor gate). Thus, unlike some previous approaches that employ a uniform gate pitch (uniform cPP such as one cPP between each transistor gate) in an peripheral area, approaches herein employ a non-uniform gate pitch in a peripheral area.

The enhanced channel stress, as detailed herein, is attributable, at least in part, to the larger widths of the source/drain epitaxy in the semiconductor material and the larger widths of the liner material. The enhanced channel stress yields the above described improvements (e.g., faster operational speeds, reduced power consumption, etc.) of a logic gate, for instance, due to improved (reduced) capacitance (e.g., miller capacitance), reduced gate delay, and/or improved (reduced) resistance. That is, logic gates with enhanced channel stress provide various improvements compared to other approaches. Additionally, logic gates with enhanced channel stress, as disclosed herein, can be formed with traditional components and/or processes. Thus, the logic gates with enhanced channel stress can be cost-effectively and efficiently manufactured.

As mentioned, the logic gates with enhanced channel stress may be incorporated in memory structures such as NAND gates and NOR gates, arrays including such memory cells, memory devices, switching devices, and other logic gates including such arrays, systems including such arrays. Embodiments of the disclosure include a variety of different memory cells (e.g., volatile memory, non-volatile memory) and/or transistor configurations. Non-limiting examples include random-access memory (RAM), read only memory (ROM), dynamic random access memory (DRAM, synchronous dynamic random access memory (SDRAM), flash memory, resistive random access memory (ReRAM), conductive bridge random access memory (conductive bridge RAM), magnetoresistive random access memory (MRAM), phase change material (PCM) memory, phase change random access memory (PCRAM), spin-torque-transfer random access memory (STTRAM), oxygen vacancy-based memory, programmable conductor memory, ferroelectric random access memory (FE-RAM), reference field-effect transistors (RE-FET), for instance. The NAND and NOR gates structures with enhanced channel stress disclosed herein may be used in volatile memory cells, such as dynamic random access memory (DRAM) cells.

Some memory devices include memory arrays having memory cells arranged in a cross-point architecture, including conductive lines (e.g., access lines, such as word lines) extending perpendicular (e.g., orthogonal) to additional conductive lines (e.g., data lines) such as digit lines. The memory arrays can be two-dimensional (2D) so as to exhibit a single deck (e.g., a single tier, a single level) of the memory cells, or can be three-dimensional (3D) so as to exhibit multiple decks (e.g., multiple levels, multiple tiers) of the memory cells. Select devices (e.g., transistors) can be used to select particular memory cells of a 3D memory array. Embodiments may include thin field transistors utilized in non-access device implementations. Non-limiting examples of which include deck selector devices, back end of line (BOEL) routing selector devices, for instance.

Embodiments of the present disclosure may include different configurations of transistors (e.g., thin-film transistors) including vertically oriented transistors, horizontally oriented transistors, etc. The logic gates can include transistors, as detailed herein, and thus can exhibit enhanced channel stress.

As used herein, "a", "an", or "a number of" can refer to one or more of something, and "a plurality of" can refer to two or more such things. For example, a memory device can refer to one or more memory devices, and a plurality of memory devices can refer to two or more memory devices.

FIG. 1A is a view of a portion of an example of a NAND gate 102 in accordance with an embodiment of the disclosure. FIG. 1B is another view (taken along section line 121 of FIG. 1A) of a portion of an example of the logic gate 102 in accordance with an embodiment of the disclosure.

FIG. 1C is a view of a portion of an example of a NAND gate 122 in accordance with an embodiment of the disclosure. FIG. 1D is another view (taken along section line 123 of FIG. 1C) of a portion of an example of the logic gate 122 in accordance with an embodiment of the disclosure. The logic gate 122 can be a PMOS logic gate including at least a PMOS drain region, as detailed herein.

The logic gates 102, 122 can include additional components such as additional source regions, drain regions, etc. than those illustrated. The logic gates 102, 122 can be NAND logic gates configured to function as a NAND memory devices. In some embodiments, the logic gates 102, 122 can be NAND gates configured to function as NAND gates.

The logic gates 102, 122 can include a semiconductor material and/or substrate. As used herein, the term "substrate" refers to a base material or construction upon which components, such as those of logic gates, are formed. The substrate may be a semiconductor substrate, a base semiconductor layer on a supporting structure, a metal electrode, or a semiconductor substrate having one or more layers, structures, or regions formed thereon. While materials described herein may be formed as layers, the materials are not limited thereto and may be formed in other three-dimensional configurations. The substrate may be a conventional silicon substrate or other bulk substrate including a layer of semiconductive material. As used herein, the term "bulk substrate" refers to not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation or other semiconductor or optoelectronic materials, such as silicon-germanium ($Si_{1-x}Ge_x$, where x may be, for example, between 0.2 and 0.8), germanium (Ge), gallium arsenide (GaAs), gallium nitride (GaN), or indium phosphide (InP). The substrate may be doped or may be undoped.

Semiconductor material 104 can be formed of any suitable semiconductor material. Examples of suitable semiconductor materials for the semiconductor material 104 include a silicon (Si) material in a polycrystalline and/or amorphous state. The semiconductor material 104 may be a doped silicon material. In some embodiments, the semiconductor material 104 can be a p-type (e.g., a p-doped) silicon material and the source regions and the drain regions can be p-doped regions.

The semiconductor material 104 may be formed by gas phase doping boron atoms (B) or germanium (Ge) atoms, as an impurity dopant, for instance at a low concentration to form the doped, p-type silicon material. In some embodiments, the semiconductor material may be formed by gas phase doping boron atoms (B) in-situ. The low doped, p-type silicon material may be an amorphous silicon material.

The logic gate 102 includes source regions such as source regions 106-1, 106-2 and drain regions such as drain region 110, which are disposed in the semiconductor material 104. While first and second source/drain region references are used herein to denote two separate and distinct source/drain regions, it is not intended that the source/drain region referred to as the "first" and/or "second" source/drain regions have some unique meaning.

The source regions and drain regions herein may respectively be formed from a doped semiconductor material such as Si, SiGe, Ge, SiCo, Transition Metal Dichalcogenides (TMD), a metal, and/or metal composite materials containing ruthenium (Ru), molybdenum (Mo), nickel (Ni), titanium (Ti), copper (Cu), a doped conducting oxide, such as indium tin oxide (ITO), indium oxide, or semiconducting oxides like IGZO, IZO, SnZnO, among other materials The source regions such as the first source region 106-1 and the second source region 106-2 along with the drain regions, such as the drain region 110, can be formed of a PMOS material. In some embodiments, the source regions and the drain regions can be formed of epitaxially grown silicon such as epitaxially grown silicon germanium. For instance, the first source region 106-1, the second source region 106-2, and the drain region 110 can each be formed of epitaxially grown silicon germanium. That is, a doped polysilicon material such as polysilicon material doped with germanium can be epitaxially grown to form the source regions such as the first source region 106-1 and the second source region 106-2 and can also form the drain regions, such as the drain regions 110.

Each of the source regions can have a respective first width. In some embodiments, each of the source regions can have the same respective width. For instance, the source regions such as a first source region 106-1 can have a first width (e.g., a first width 108-1 as illustrated in FIG. 1B) that is the same (equal to) a first width (e.g., the first width 108-2) of the second source region 106-2.

Each of the drain regions can have a respective second width. In some embodiments, each of the drain regions can have the same respective width (e.g., the second width 113).

Notably, a width of the source regions can be different than a width of the drain regions. For instance, a first width of the source regions can be greater than a second width of the drain regions, as illustrated in FIGS. 1A and 1B. In some embodiments, the first width can be at least two times greater than the second width. For instance, the first width can be two times greater than the second width. In some embodiments, each of the source regions can have a first width that is two times greater than a second width of each of the source regions. Having the first width of the source regions be greater (e.g., two times greater) than a second width of the drain regions can result in improved properties, as detailed herein.

However, in some embodiments, a second width of the drain regions can be greater than a first width of the source regions, as illustrated in FIGS. 1C and 1D. In some embodiments, the second width of the drain regions can be at least three times greater than a first width of the source regions. For instance, the second width of the drain regions can be three times greater than a first width of the source regions, as detailed herein with respect to FIGS. 1C, 1D. In some embodiments, each of the drain regions can have a second width that is three times greater than a first width of each of the source regions. Having the second width of the drain regions be greater (e.g., three times greater) than a first width of the source regions can result in improved properties, as detailed herein.

Transistor gates such as transistor gates 112-1, 112-2, 112-3, 112-4 (collectively referred to herein as transistor gates 112) can be disposed on (e.g., physical located on) an upper surface of a semiconductor material 104. The transistor gates 112 can be formed as described in U.S. Pat. No. 9,536,6877, the entire contents of which is herein incorporated by reference. For instance, the transistor gates 112 can be manufactured using "gate-first" or "replacement gate" (gate-last) manufacturing techniques, among other possibilities.

The transistor gates 112 can be configured to operatively interconnect with a channel region (located between source/drain regions) to selectively allow current to pass through the channel region when a transistor is enabled (e.g., "on"). The transistor gates can be conductive. The transistor gates can include one or more of a doped semiconductor such as doped silicon, doped germanium, etc., a conductive metal nitride such as titanium nitride, tantalum nitride, etc., a metal, (e.g., tungsten (W), titanium (Ti), tantalum (Ta), ruthenium (Ru), cobalt (Co), molybdenum (Mo), etc.), and/or a metal-semiconductor compound such as tungsten silicide, cobalt silicide, titanium silicide, etc., and combinations thereof, for instance. For example, the transistor gates 112 can be replacement gate comprised of a high-k gate insulation layer and at least one layer of metal that acts as a portion of a gate electrode.

In some embodiments, each transistor gate of the transistor gates 112 is disposed between a source region of the plurality of source regions and a drain region. For instance, a second transistor gate 112-2 can be disposed between the first source region 106-1 and the drain region 110.

As mentioned, embodiments herein provide for a non-uniform gate pitch, such as a non-uniform gate pitch in a peripheral area. For instance, a cPP 111-1 of a first subset of the transistor gates 112 can be at least two times greater than a cPP 111-2 of a second subset of the transistor gates 112, as illustrated in FIG. 1B. However, in some embodiments, a cPP 115-1 of a first subset of the transistor gates 112 can be at least three times greater than a cPP 115-2 of a second subset of the transistor gates 112, for instance as illustrated in FIG. 1D.

The logic gates 102, 122 can include shallow trench isolation (STI) 116-1, 116-2. The STI 116-1, 116-2 can be formed of an oxide or other suitable material. The STI 116-1, 116-2 can isolate different regions and/or portions in the logic gates 102, 122.

The logic gate 102 can include electrical contacts 118-1, 118-2, 118-3 (collectively referred to herein as electrical contacts 118). The electrical contacts 118 can be coupled to the source regions, such as the first source region 106-1 and the second source regions 106-2, and the drain regions, such as the drain region 110. The electrical contacts 118 can be self-aligned contacts, which are formed and conductively coupled to the source regions and drain regions of the logic gates 102, 122.

In some embodiments, the electrical contacts 118 can be local interface contacts (LICON) coupled to respective ones of the source regions and the drain regions. For instance, in some embodiments a respective electrical contact of the electrical contacts 118 is coupled to each source region. Similarly, in some embodiments, a respective electrical contact of the electrical contacts is coupled to each drain region. For instance, a first electrical contact 118-1 can be coupled to the first source region 106-1, a second electrical contact 118-2 can be coupled to the drain region 110, and a third electrical contact 118-3 can be coupled to the second source region 106-2. That is, the logic gates herein are dummy gate and active region-free and include a respective electrical contacts coupled to each source region and each drain region in a semiconductor material 104, unlike other approaches that employ dummy gates and/or active regions. As a result, the logic gates herein can efficiently utilize a given amount of area and/or can realize higher performance, as detailed herein.

In some embodiments, each of the LICON can be spaced apart a uniform distance as illustrated in FIGS. 1A, 1B, 1C, 1D, 2A, 2B, 2C, and 2B. However, in some embodiments, a first subset of the LICON is a first distance apart and a second subset LICON are spaced a second distance apart that is different than the first distance.

In some embodiments, at least one electrical contact such as a LICON coupled to the respective source regions can be located off-center in the respective source region. For instance, each LICON coupled to respective source regions can be located off-center in the respective source regions. For example, the first electrical contact 118-1 can be located off-center relative to (e.g., being spaced a distance from) a plane 119 extending through a midpoint of the first source region 106-1, as illustrated in FIG. 1B.

Having an electrical contact be located off-center can optimize a contact to gate (CTG) distance for best performance such as reduced resistance, etc. The reduced CTG distance can reduce access resistance from channel to the contacts, but can also reduce capacitance, as compared to other approaches that have electrical contacts located at a center or mid-point of a source region. For instance, a CTG distance (e.g., CTG distance 120, as illustrated in FIG. 1B) of the first electrical contact 118-1 to the second transistor gate 112-2 can be larger than other approaches such as those that employ dummy gates and can reduce the capacitance. Stated differently, due at least in part to a first width of the source regions being at least two times greater than a second width of drain regions, an electrical contact can be located closer (more proximate to) an adjacent transistor gate to realize a smaller CTG, and yet the transistor gates and logic gate can function as intended (e.g., without unwanted electrical interference/shorts, etc.). However, in some embodiments the electrical contacts can be located at a center or mid-point of source/drain regions (e.g., each source region and each drain region) and still yield at least a degree of enhanced performance, as compared to other approaches such as those described herein.

FIG. 2A is a view of a portion of an example of a NOR gate 240 in accordance with an embodiment of the disclosure. FIG. 2B is another view (taken along section line 241 of FIG. 2A) of a portion of an example of the NOR gate n-type 240 in accordance with an embodiment of the disclosure. The logic gate 240 can be a NMOS logic gate including at least a NMOS source region, as detailed herein.

FIG. 2C is a view of a portion of an example of a NOR gate 242 in accordance with an embodiment of the disclosure. FIG. 2D is another view (taken along section line 243 of FIG. 2C) of a portion of an example of the NOR gate n-type logic gate 242 in accordance with an embodiment of the disclosure. The logic gate 242 can be a NMOS logic gate including at least a NMOS drain region, as detailed herein.

The logic gates 240, 242 may include the same or similar elements as the logic gates 102, 122. For example, transistor gates 212-1, 212-2, 212-3, 212-4 can be analogous or similar to transistor gates 112-1, 112-2, 112-3, 112-4. Electrical contacts 218-1, 218-2, 218-3 can be analogous or similar to the electrical contacts 118-1, 118-2, 118-3. STI 216-1, 216-1 can be analogous or similar to the STI 116-1, 116-2.

The logic gates 240, 242 can include additional components such as additional source regions, drain regions, etc. than those illustrated. The logic gates 240, 242 can be NOR logic gates. In some embodiments, the logic gates 240, 242 can be NOR gates configured to function as NOR gates.

The logic gates 240, 242 can include a semiconductor material 244. The semiconductor material 244 can be formed of any suitable semiconductor material. In some embodiments, the semiconductor material 244 may be a doped semiconductor material. For instance, the semiconductor material 244 can be a n-type (e.g., a n-doped) silicon material and the source regions and the drain regions can be n-doped regions. The source regions and drain regions can have the different types of dopants and/or different amounts of dopant than the semiconductor material.

The logic gate 240 includes source regions such as source regions 246-1, 246-2 and drain regions such as a drain region 250 disposed in the semiconductor layer 244. That is, the source regions and drain regions can be located below and/or coplanar with a top surface of the semiconductor layer such as the semiconductor layer 244. The source regions, such as a first source region 246-1 and a second source region 246-2, along with the drain regions, such as the drain region 250, can be formed of a NMOS material. The source regions and drain regions may respectively be formed from a doped semiconductor material such as Si, SiGe, Ge, SiCo, Transition Metal Dichalcogenides (TMD), a metal, and/or metal composite materials containing ruthenium (Ru), molybdenum (Mo), nickel (Ni), titanium (Ti), copper (Cu), a doped conducting oxide, such as indium tin oxide (ITO), indium oxide, or semiconducting oxides like IGZO, IZO, SnZnO, among other materials.

Each of the source regions in the logic gates 240, 242 can have the same respective width. For instance, the first source region 246-1 can have a first width 248-1 that is equal to a first width 248-2 of the second source region 246-2. Each of the drain regions can have a respective second width 252 that is different than the first width 248-1, 248-2. Each of the drain regions in the logic gates 240, 242 can have the same respective width (e.g., the second width 252).

As mentioned, a width of the source regions can be different than a width of the drain regions in the logic gates herein, such as the logic gates 240, 242. For instance, a first width of the source regions can be greater than a second width of the drain regions, as illustrated in FIGS. 2A and 2B. In some embodiments, the first width can be at least two times greater than the second width. For instance, a first width can be two times greater than the second width. In some embodiments, each of the source regions can have a first width that is two times greater than the a second width of each of the source regions. As mentioned, having the first width of the source regions be greater (e.g., two times greater) than a second width of the drain regions can result in improved properties, as detailed herein.

However, in some embodiments, a second width of the drain regions can be greater than a first width of the source regions, as illustrated in FIGS. 2C and 2D. In some embodiments, the second width of the drain regions can be at least three times greater than a first width of the source regions. For instance, in some embodiments, second width 253 of the drain regions such as the drain region 250 can be three times greater than a first width 249-1 of the first source region 246-1 and a first width 249-2 of the second source region 246-2, as illustrated in FIGS. 2C and 2D. In some embodiments, each of the drain regions can have a second width that is three times greater than the a first width of each of the source regions. As mentioned, having the second width of the drain regions be greater (e.g., three times greater) than a first width of the source regions can result in improved properties such as enhanced capacitance, as detailed herein.

As mentioned, embodiments herein provide for a non-uniform gate pitch, such as a non-uniform gate pitch in a peripheral area. For instance, a cPP 245 of a first subset of the transistor gates 212 can be at least two times greater than a cPP 247 of a second subset of the transistor gates 212, for instance as illustrated in FIG. 2B. However, in some embodiments, a cPP 256 of a first subset of the first subset of the transistor gates 212 can be at least two times or at least three times greater than a cPP 255 of a second subset of the transistor gates 212, for instance as illustrated in FIG. 2D.

Embodiments herein can include a liner material 219. The liner material 219 can be conformally deposited or otherwise configured on a top surface of the transistor gates 212 and a top surface of the source regions 246 and the drain regions such as the drain region 250, as illustrated in FIGS. 2B and 2D. Stated differently, the liner material 219 can be a continuous layer of material that overlays each of the transistor gates and each of the source regions and the drain regions. The liner material 219 can be formed of various materials such as nitrides including a silicon nitride material, a silicon oxynitride material, etc., or a combination thereof. As illustrated in FIGS. 2B and 2D, the liner material 219 can be present in embodiments where the semiconductor material 244 is n-doped semiconductor material and source regions such as the source regions 246-1, 246-2 and drain regions such are the drain region 250 are n-doped regions.

The liner material 219 can at least in part cause the logic gates 240, 244 to exhibit enhanced channel stress, for instance by imparting a tensile force on the source/drain regions and/or a channel region located between the source/drain regions. As mentioned, portions of the liner material 219 having different respective widths and thus can increase an amount of channel stress exhibited by at least some portions of the logic gates 240, 244. That is, the liner material 219 can have portions with different widths between different respective transistor gates of the transistor gates 212. For example, the different portions of the liner material 219 can extend between a centerline or midpoint of a given transistor gate to a centerline or midpoint of another transistor gate that is adjacent to the given gate. For instance, the liner material 219 can include a first portion 220-1 between transistor gate 212-2 and gate transistor 212-3 having a first width (e.g., equal to cPP 256) and a second portion 220-2 between transistor gate 212-1 and transistor gate 212-2 having a second width (e.g., equal to cPP 255) that is different than the first width, as illustrated in FIG. 2D. In some embodiments, the first width of the first portion of the liner material 219 can be at least two times or at least three times greater than the second width of a second portion of the liner material 219.

FIGS. 1A, 1B, 1C, 1D, 2A, 2B, 2C, and 2D illustrate various size and relative dimensions of components such as source regions and drain regions, it is understood that the Figures are merely illustrative of various examples and that other sizes and relative dimensions, as described herein, are possible. While the Figures herein represent aspects components such as various cPP, the Figures may not be drawn to exact dimensions and/or relative dimensions.

Embodiments provide that the logic gates disclosed herein and/or devices including the transistors may be made using various processing techniques such as atomic material deposition (ALD), physical vapor deposition (PVD), chemical vapor deposition (CVD), supercritical fluid deposition (SFD), patterning, etching, filling, chemical mechanical planarization (CMP), combinations thereof, and/or other suitable processes. In accordance with a number of embodiments of the present disclosure, materials may be grown in situ.

As an example, the logic gates disclosed herein and/or devices including the logic gates may be made by forming a material stack (e.g., on a substrate) such as a semiconductor material, the source/drain material, a dielectric material, and/or a gate material to form the transistor gates. The material stack may include one or more additional materials utilized for transistor and/or logic gates including transistors, fabrication. Processing steps can include, among others, patterning and etching the material stack, selectively removing a portion of one or more materials, depositing a material, and planarization to make transistors, transistor gates, and/or logic gates disclosed herein.

Figure 3:
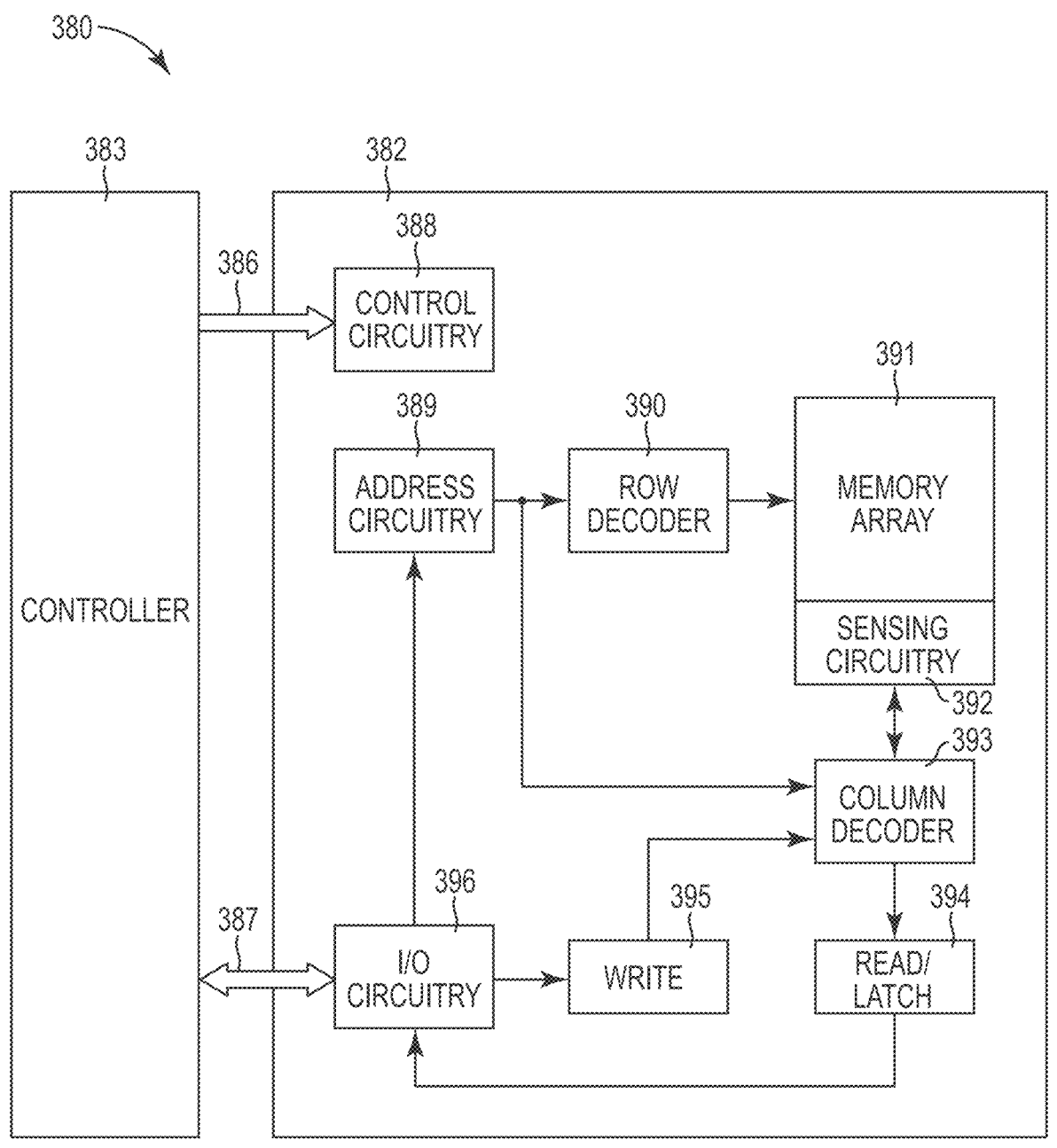
FIG. 3 is a block diagram illustration of an example apparatus, such as an electronic memory system, in accordance with an embodiment of the disclosure.

FIG. 3 is a block diagram illustration of an example apparatus, such as an electronic memory system 380, in accordance with an embodiment of the present disclosure. Memory system 380 may include an apparatus, such as a memory device 382 and a controller 383, such as a memory controller such as a host controller. Controller 383 might include a processor, for example. Controller 383 might be coupled to a host, for example, and may receive command signals (or commands), address signals (or addresses), and data signals (or data) from the host and may output data to the host.

Memory device 382 includes a memory array 391 of memory cells. For example, memory array 391 may include one or more of the memory arrays, such as a cross-point array, among other types arrays. The memory array 391 may include a number of transistors where the source regions and drain regions of different widths, as disclosed herein. Memory device 382 may include address circuitry 389 to latch address signals provided over I/O connections 387 through I/O circuitry 396. Address signals may be received and decoded by a row decoder 390 and a column decoder 393 to access the memory array 391.

Memory device 382 may sense (e.g., read) data in memory array 391 by sensing voltage and/or current changes in the memory array columns using sense/buffer circuitry that in some examples may be read/latch circuitry 394. Read/latch circuitry 394 may read and latch data from the memory array 391. Sensing circuitry 392 may include a number of sense amplifiers coupled to memory cells of memory array 391, which may operate in combination with the read/latch circuitry 394 to sense (e.g., read) memory states from targeted memory cells. I/O circuitry 396 may be included for bi-directional data communication over the I/O connections 387 with controller 383. Write circuitry 395 may be included to write data to memory array 391.

Control circuitry 388 may decode signals provided by control connections 386 from controller 383. These signals may include chip signals, write enable signals, and address latch signals that are used to control the operations on memory array 391, including data read and data write operations.

Control circuitry 388 may be included in controller 383 and/or in the memory device 382, for example. Controller 383 may include other circuitry, firmware, software, or the like, whether alone or in combination. Controller 383 may be an external controller (e.g., in a separate die) from the memory array 391, whether wholly or in part, or an internal controller (e.g., included in a same die) as the memory array 391. For example, an internal controller might be a state machine or a memory sequencer.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A logic gate, comprising:
a semiconductor material;
a plurality of first source/drain regions disposed in the semiconductor material, each first source/drain region of the plurality of first source/drain regions having a first width;
a second source/drain region disposed in the semiconductor material, the second source/drain region having a second width that is different than the first width;
a plurality of transistor gates disposed on the semiconductor material; and
a plurality of electrical contacts coupled to the plurality of first source/drain regions and the second source/drain region, wherein:

each respective electrical contact of the plurality of electrical contacts that are coupled to each respective first source/drain region of the plurality of first source/drain regions is located off-center in each respective first source/drain region and an electrical contact of the plurality of electrical contacts that is coupled to the second source/drain region is located in a center of the second source/drain region.

2. The logic gate of claim 1, wherein the logic gate further comprises a NAND gate or a NOR gate.

3. The logic gate of claim 1, wherein the first width is at least two times greater than the second width.

4. The logic gate of claim 1, wherein the second width is at least three times greater than the first width.

5. The logic gate of claim 4, wherein the second width is three times greater than the first width.

6. A logic gate, comprising:
a semiconductor material;
a plurality of first source/drain regions disposed in the semiconductor material, each first source/drain region of the plurality of first source/drain regions having a first width;
a second source/drain region disposed in the semiconductor material, the second source/drain region having a second width that is different than the first width;
a plurality of transistor gates disposed on the semiconductor material, wherein each transistor gate of the plurality of transistor gates is respectively disposed between a first source/drain region of the plurality of first source/drain regions and the second source/drain region; and
a plurality of local interface contacts (LICON), wherein:
a respective LICON of the plurality of LICON is coupled to each first source/drain region of the plurality of first source/drain regions;
a respective LICON of the plurality of LICON is coupled to the second source/drain region; and
the respective LICON of the plurality of LICON that are coupled to each first source/drain region of the plurality of first source/drain regions is located off-center in each first source/drain region when the first width is greater than the second width, and the respective LICON of the plurality of LICON that are coupled to the second source/drain region are located in a center of the second source/drain region.

7. The logic gate of claim 6, wherein the plurality of first source/drain regions and the second source/drain region are n-doped regions.

8. The logic gate of claim 6, wherein the plurality of first source/drain regions and the second source/drain region are p-doped regions.

9. The logic gate of claim 8, further comprising a liner material overlying the plurality of first source/drain regions, the second source/drain region, and the plurality of transistor gates, the liner material including a first portion of the liner material having a third width and a second portion of the liner material having a fourth width that is different than the third width.

10. The logic gate of claim 6, wherein:
the first width is at least two times greater than the second width; or
the second width is at least three times greater than the first width.

11. A logic gate, comprising:
a semiconductor material;
first source/drain regions disposed in the semiconductor material, wherein each of the first source/drain regions has a first width;
a second source/drain region disposed in the semiconductor material, wherein the second source/drain region has a second width that is different than the first width;
transistor gates disposed on the semiconductor material, wherein the transistor gates have a non-uniform pitch; and
local interface contacts (LICON) coupled to each of the first source/drain regions and the second source/drain region, wherein each respective LICON that is coupled to each first source/drain region is located off-center in each first source/drain region when the first width is greater than the second width, and each respective LICON that is coupled to the second source/drain region is located in a center of the second source/drain region.

12. The logic gate of claim 11, wherein the logic gate is dummy gate-free and active region-free.

13. The logic gate of claim 11, wherein:
the logic gate is a NAND gate, and wherein a first subset of the transistor gates has a pitch that is at least two times a pitch of a second subset of the transistor gates; or
the logic gate is a NOR gate, and wherein the first subset of the transistor gates has a pitch that is at least three times a pitch of the second subset of the transistor gates.

14. The logic gate of claim 11, wherein the first source/drain regions and the second source/drain regions are formed of epitaxially grown silicon-germanium.

* * * * *